(12) United States Patent
Ysaguirre et al.

(10) Patent No.: US 7,602,201 B2
(45) Date of Patent: Oct. 13, 2009

(54) HIGH TEMPERATURE CERAMIC SOCKET CONFIGURED TO TEST PACKAGED SEMICONDUCTOR DEVICES

(75) Inventors: Jose Ysaguirre, Soquel, CA (US); Jens Ullmann, San Jose, CA (US); Adalberto M. Ramirez, Hayward, CA (US); Robert J. Sylvia, Santa Clara, CA (US)

(73) Assignee: Qualitau, Inc., Sunnyvale, CA (US)

( * ) Notice: Subject to any disclaimer, the term of this patent is extended or adjusted under 35 U.S.C. 154(b) by 21 days.

(21) Appl. No.: 11/766,938

(22) Filed: Jun. 22, 2007

(65) Prior Publication Data

US 2008/0315900 A1    Dec. 25, 2008

(51) Int. Cl.
G01R 31/02 (2006.01)
H01R 12/00 (2006.01)
H01K 1/00 (2006.01)

(52) U.S. Cl. .................................. 324/755; 439/70
(58) Field of Classification Search ................ 324/755; 439/70
See application file for complete search history.

(56) References Cited

U.S. PATENT DOCUMENTS

| | | | | |
|---|---|---|---|---|
| 4,326,765 A | * | 4/1982 | Brancaleone | 439/69 |
| 5,038,467 A | | 8/1991 | Murphy | |
| 5,199,889 A | | 4/1993 | McDevitt, Jr. | |
| 5,399,108 A | * | 3/1995 | Lu et al. | 439/682 |
| 5,479,105 A | * | 12/1995 | Kim et al. | 324/755 |
| 5,519,331 A | | 5/1996 | Cowart et al. | |
| 5,523,586 A | * | 6/1996 | Sakurai | 257/48 |
| 5,534,787 A | | 7/1996 | Levy | |
| 5,568,057 A | * | 10/1996 | Kim et al. | 324/755 |
| 6,208,155 B1 | | 3/2001 | Barabi et al. | |
| 6,278,283 B1 | | 8/2001 | Tsugai | |
| 6,667,628 B2 | | 12/2003 | Ahrikencheikh et al. | |
| 6,798,228 B2 | * | 9/2004 | Cuevas | 324/755 |
| 6,821,131 B2 | | 11/2004 | Suzuki et al. | |
| 6,958,616 B1 | * | 10/2005 | Mahoney et al. | 324/754 |
| 7,172,450 B1 | | 2/2007 | Sylvia et al. | |
| 2004/0140821 A1 | * | 7/2004 | Lee | 324/754 |
| 2005/0280428 A1 | * | 12/2005 | Ishikawa et al. | 324/754 |

OTHER PUBLICATIONS

International Search Report from Corresponding PCT Application No. PCT/US08/63902 dated Aug. 19, 2008.
Written Opinion from Corresponding PCT Application No. PCT/US08/63902 dated Aug. 19, 2008.

* cited by examiner

Primary Examiner—Jermele M Hollington
Assistant Examiner—Karen M Kusumakar
(74) Attorney, Agent, or Firm—Beyer Law Group LLP

(57) ABSTRACT

A test socket assembly is for use in testing integrated circuits. A single piece socket is formed substantially of an insulating material and having a plurality of holes formed therein configured to receive a plurality of electrically conductive springs. Each hole of the single piece socket has therein a separate one of the electrically conductive springs. A test socket includes a plurality of pins configured to receive leads of an integrated circuit, the pins of the test socket extending into the plurality of holes of the single piece socket with each pin engaging a spring, wherein the single piece socket is positioned on a circuit board with the plurality of holes being in alignment with electrical contacts on the circuit board such that the plurality of springs are electrically interconnecting the contacts and the plurality of pins. The single-piece socket is comprised substantially of a high-temperature insulating material, such as ceramic.

11 Claims, 4 Drawing Sheets

*(Does not Disclose the Invention)*

*(Does not Disclose the Invention)*

HIGH TEMPERATURE CERAMIC SOCKET CONFIGURED TO TEST PACKAGED SEMICONDUCTOR DEVICES

BACKGROUND

The invention relates generally to sockets to receive packaged integrated circuits for test purposes and, more particularly, to a test socket to receive leads of a semiconductor package such as a dual in-line semiconductor package, or DIP.

In the manufacture of integrated semiconductor circuits (ICs), the final packaged IC is generally subjected to testing such as parametric and reliability testing in harsh environmental conditions. Sockets are provided to receive and protect the leads of the IC during the test. Typically, test sockets are mounted on a printed circuit board (PCB) with a PCB providing interconnections between the ICs and test equipment.

A conventional test socket is shown in an exploded view in FIG. 1. Pins 10 having holes for receiving the IC leads are housed between a bottom plate 12 and a top plate 14. The diameter of each pin 10 is smaller at the bottom for reception in a hole 16 through bottom plate 12 with a recessed larger portion hole being configured to receive a flange on the upper end of each pin 10. Once the pins are assembled in bottom plate 12, top plate 14 is assembled to bottom plate 12 by suitable fasteners such as screws (not shown) to retain the pins in the bottom plate 12. Top plate 14 has holes 18 extending therethrough in alignment with pins 10 and configured to receive leads of an IC package. However, holes 18 are smaller in diameter than the flanges of pins 10 whereby the pins 10 are captured between the top plate 14 and the bottom plate 12.

FIG. 2 illustrates a socket, such as the FIG. 1 socket, attached to a printed circuit board (PCB) 40. To assemble the test sockets on a PCB, the pins 10 of the sockets are aligned with the conductive pads 34 on the PCB. Several screws 38 are provided through the PCB 40 and into the bottom plate 12 and top plate 14 via a holder plate 30. The leads 48 of the IC 50 may be inserted into the holes 18 to achieve the electrical connection to the pads 34 via the pins 10 and springs 36.

The socket is made from a conductive material coated with a non-conductive material. The coating of non-conductive material is to prevent shorting from one IC lead 48 to another IC lead 48.

SUMMARY

A test socket assembly is for use in testing integrated circuits. A single piece socket is formed substantially of an insulating material and having a plurality of holes formed therein configured to receive a plurality of electrically conductive springs. Each hole of the single piece socket has therein a separate one of the electrically conductive springs. A test socket includes a plurality of pins configured to receive leads of an integrated circuit, the pins of the test socket extending into the plurality of holes of the single piece socket with each pin engaging a spring, wherein the single piece socket is positioned on a circuit board with the plurality of holes being in alignment with electrical contacts on the circuit board such that the plurality of springs are electrically interconnecting the contacts and the plurality of pins. The single-piece socket is comprised substantially of a high-temperature insulating material, such as ceramic.

DETAILED DESCRIPTION

The inventors have realized that, with extensive use and, further, due to manufacturing limitations of the socket, the non-conductive material of test sockets such as described in the Background disintegrates, resulting in inadvertent shorts between one IC lead and another. The inventors have further realized that assembly of the three-plate structure, that holds the pins and springs, can be time consuming. In accordance with one aspect, the socket is formed of a non-conductive material such as ceramic. In accordance with another aspect, a one-piece socket is provided, which makes the socket assembly more manufacturable (with a decrease in both cost of parts and labor), and also provides improved reliability and performance.

Figure 1:
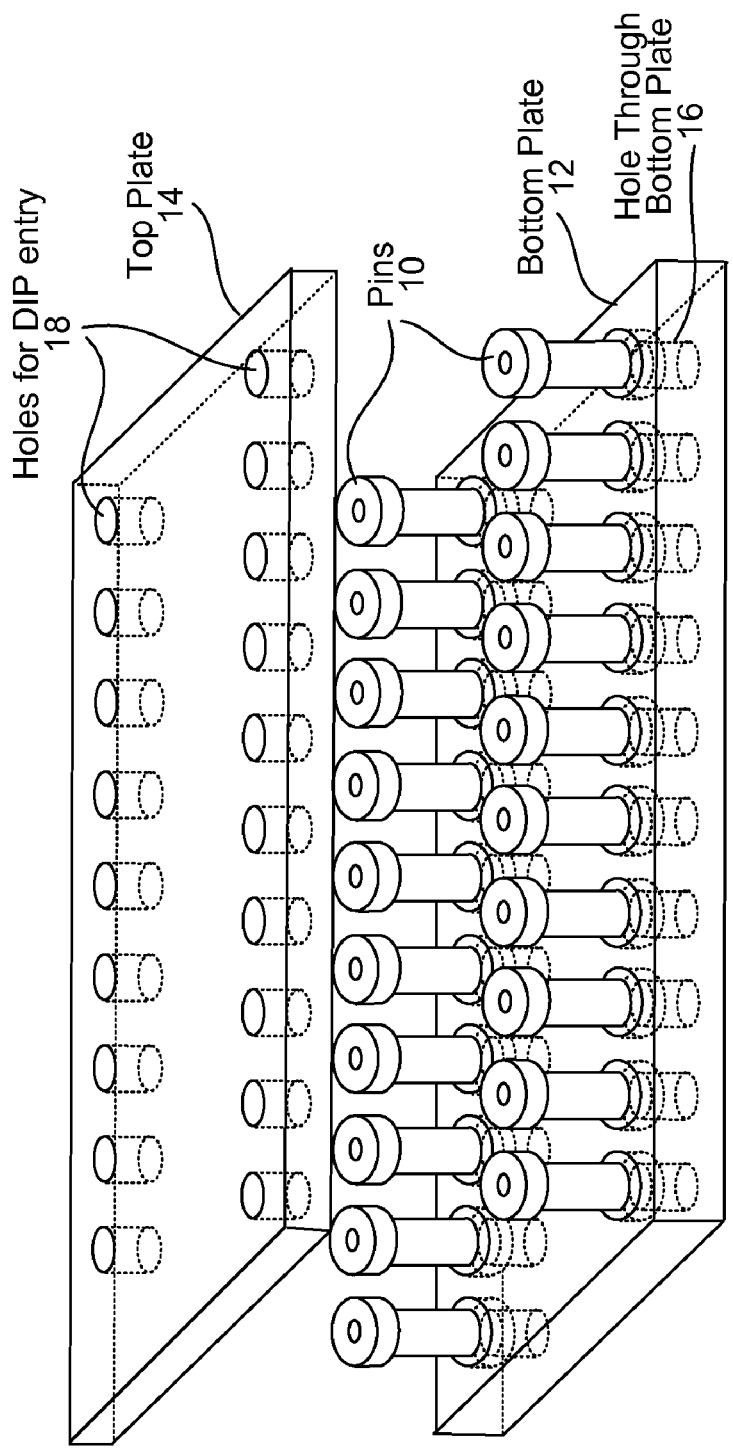
FIG. 1 is an exploded view of a conventional test socket.
Figure 2:
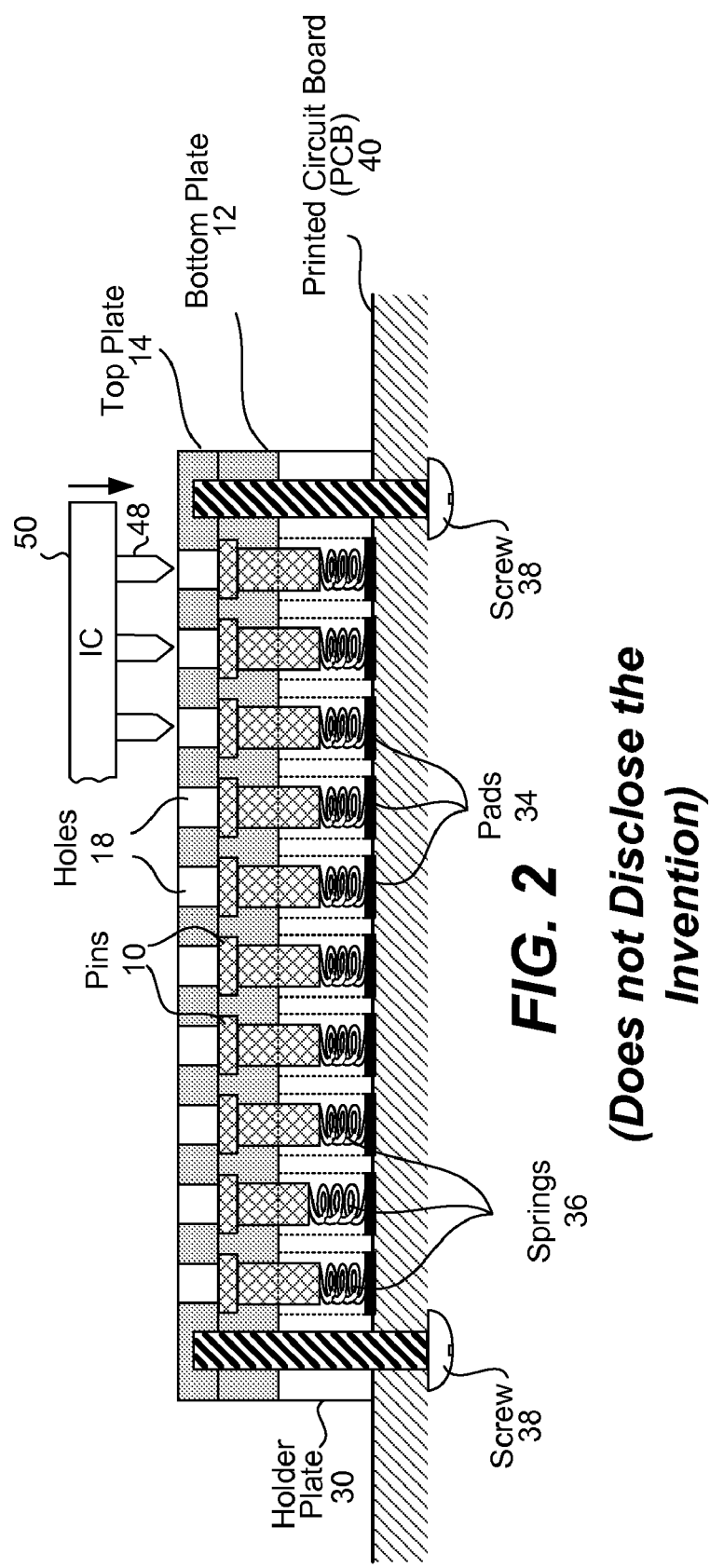
FIG. 2 is a side view in section of the FIG. 1 conventional test socket in a configuration attached to a printed circuit board for testing an integrated circuit.
Figure 3:
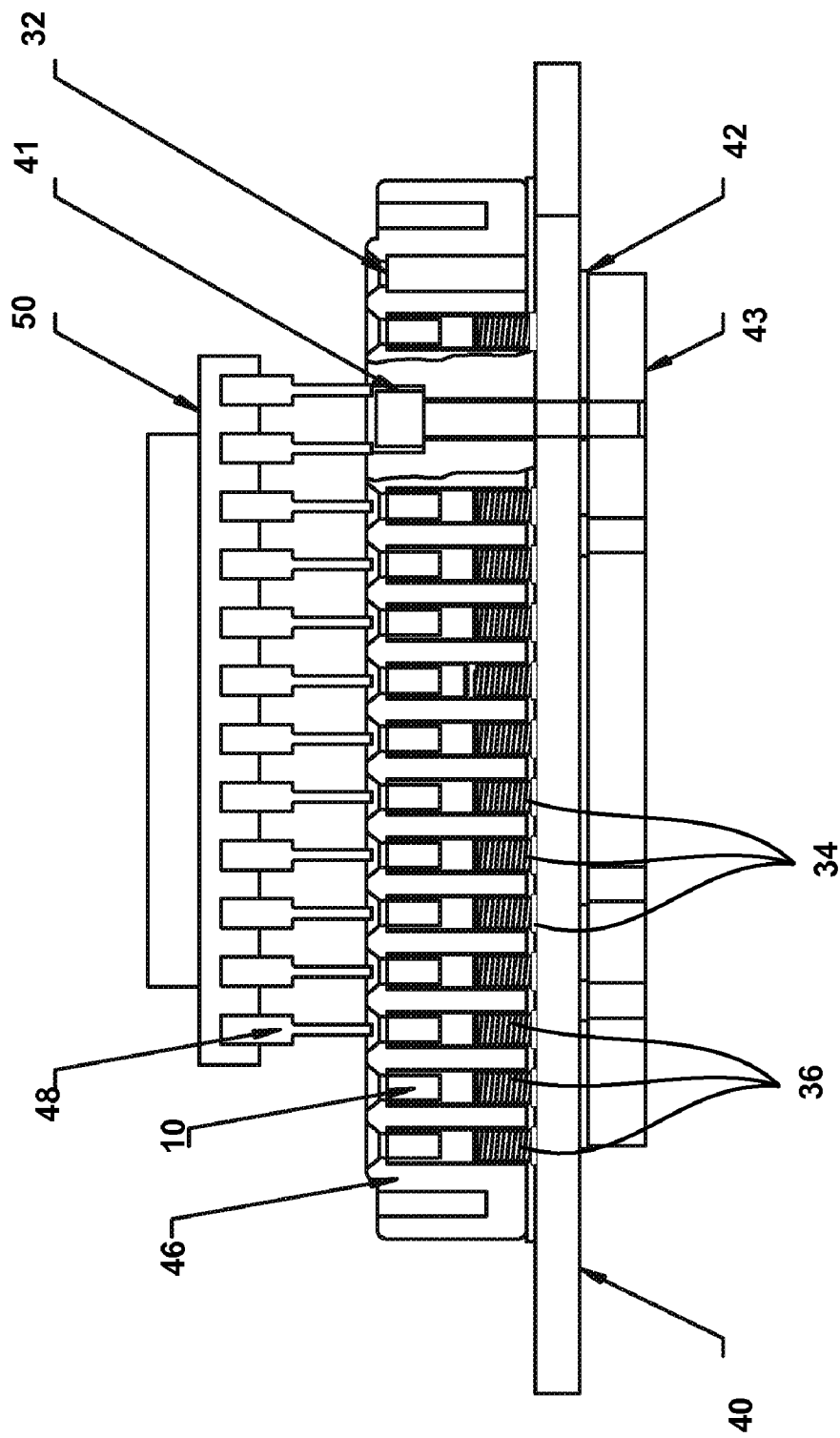
FIG. 3 is a side view in section of an improved socket assembly.

We now discuss an example of an improved socket assembly with reference to FIG. 3. Referring to FIG. 3, a socket 46 formed of an insulating material that can withstand high temperature, such as ceramic, is positioned on a PCB 40. The socket 46 has holes 32 aligned with contact pads 34 on the PCB. Positioned in holes 32 are pins 10 and helical springs 36 formed, for example, of a very thin, gold plated, high temperature spring wire. The springs 36 have a diameter similar to the pins 10 but slightly smaller than the base of the pins to ensure contact with the socket pins, and holes 32 in the socket are slightly larger than the socket pins for reception of the pin in engagement with springs 36. Both pins 10 and springs 36 are held in place inside the holes 32 in the body of socket 46.

Socket 46 is secured to PCB 40 using several screws 41, or other suitable fasteners, which travels through socket 46, through PCB 40, and held in place into a steel nut-plate 43. A thin insulating material 42 is between PCB 40 and nut-plate 43 to minimize the chance of the nut-plate electrically shorting to PCB 40 circuit conductors or causing mechanical abrasions to PCB 40.

In use of the socket assembly, leads 48 of the integrated circuit 50 (only a portion shown) are received in holes 32 of the socket assembly, and physically engage the pins 10 which are electrically connected to pads 34 via the springs 36 being compressed. The sockets are "non-ZIF," meaning that non-zero insertion force is required to insert and/or remove the packaged test devices into the sockets, such as by using a commercially available tool to insert and remove the packaged test devices using a certain amount of physical force.

The socket assembly may allow for placement of, for example, single packaged devices with up to 28 pins in 300 or 600 mil widths, as well as two smaller packages up to 14 pins each in either 300 or 600 mil widths, placed in a serial end-to-end or back-to-back configuration. The 600 mil packages may also be placed in a side-by-side parallel configuration of two 14-pin packed integrated circuits end-to-end, as well as side-by-side. These are just examples, and many other configurations may be possible.

Figure 4:
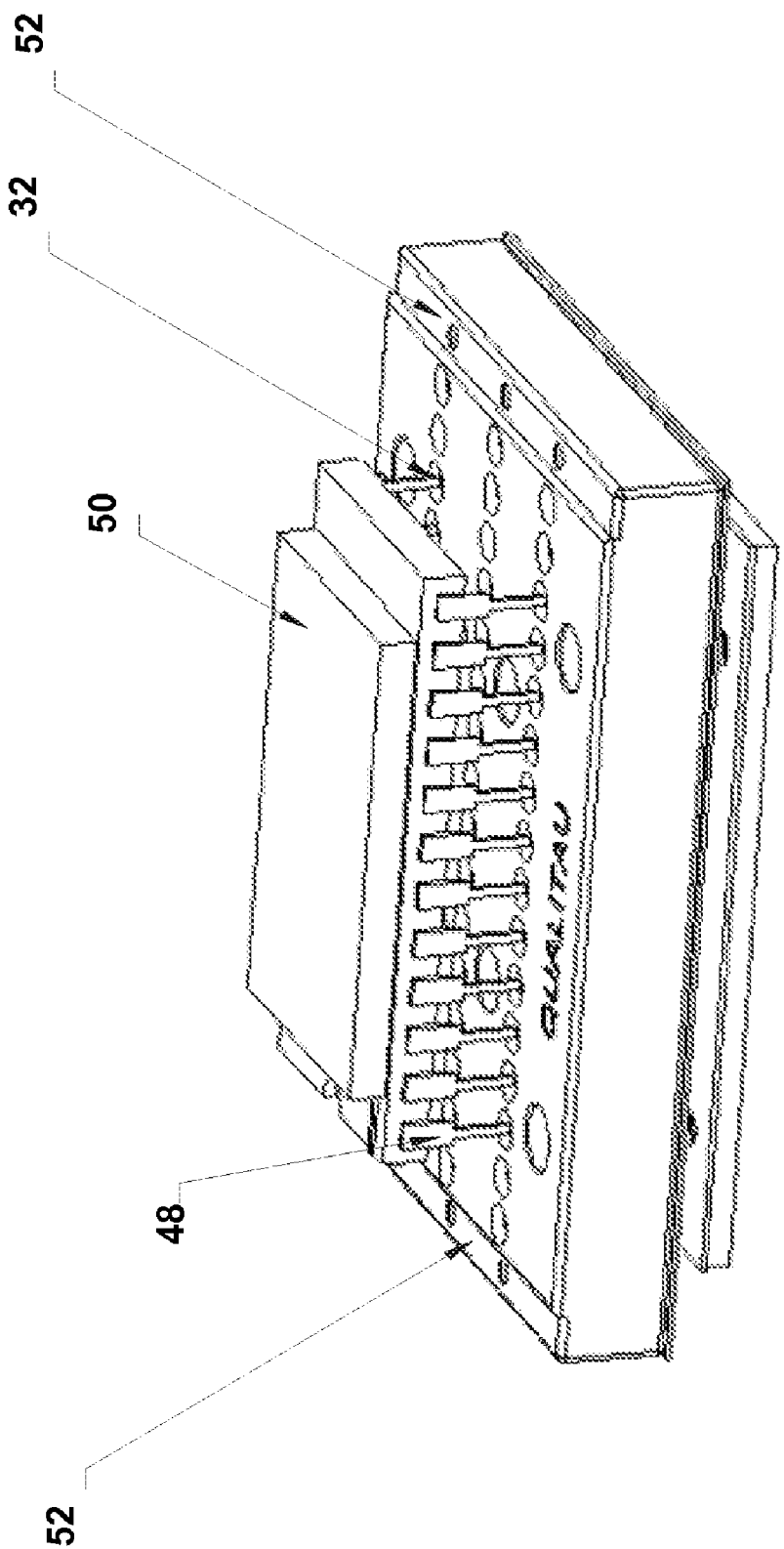
FIG. 4 illustrates a perspective view of the FIG. 3 socket assembly.

FIG. 4 illustrates a perspective view of the FIG. 3 socket assembly, including leads 48 of the integrated circuit 50 received in holes 32 of the socket assembly. From this perspective view, the three rows of holes 32 are visible. In addition, the FIG. 4 perspective view also shows steps 52 at the ends of the socket. The steps 52 at the two ends and blank holes on those steps are features that allow, for example, for longer packages to be tested without the user having to trim package pins. In addition, conventional IC removal tools, such as a flat screwdriver, may be used against the step surface to remove test packages.

By contrast to the three-plate structure described in the Background, the socket of the socket assembly is integrally formed of a single piece, thus enhancing the manufacturability. In addition, by being formed substantially of an insulating material, and preferably one that can withstand high temperature, the probability of a short being caused by the socket is minimized (e.g., as a result of a thin coating of insulating material being disintegrated).

What is claimed is:

1. A test socket assembly for use in testing an integrated circuit, the test socket assembly comprising:

an integrally formed single piece socket formed substantially of an insulating material, the single piece socket having a top portion and a bottom portion, wherein the single piece socket has a plurality of holes formed therein, the holes being configured to receive a plurality of electrically conductive springs from the bottom portion of the single piece socket;

a plurality of pins, each pin being positioned in one of the plurality of holes of the single piece socket, and each pin configured to receive a lead of the integrated circuit to be tested, by non-zero insertion force of the leads of the integrated circuit through the top portion of the single piece socket; and the plurality of electrically conductive springs, each hole having therein a separate one of the electrically conductive springs;

wherein the single piece socket is positionable on a circuit board with the plurality of holes being in alignment with electrical contacts on the circuit board such that the plurality of springs are electrically interconnecting the contacts and the plurality of pins.

2. A test socket assembly as defined by claim 1 and further including fasteners that fasten the test socket assembly to the circuit board.

3. A test socket assembly as defined by claim 1 wherein the single-piece socket is comprised substantially of a high-temperature insulating material.

4. A test socket assembly as defined by claim 1 wherein the single-piece socket is comprised substantially of ceramic.

5. A test assembly for use in testing integrated circuits comprising:

a) a circuit board having a plurality of pads connectable to test equipment; and b) test socket assembly, the test socket assembly comprising:

an integrally formed single piece socket formed substantially of an insulating material, the single piece socket having a top portion and a bottom portion, wherein the single piece socket has a plurality of holes formed therein, the holes being configured to receive a plurality of electrically conductive springs from the bottom portion of the single piece socket;

a plurality of pins, each pin being positioned in one of the plurality of holes of the single piece socket, and each pin configured to receive a lead of the integrated circuit to be tested by non-zero insertion force of the leads of the integrated circuit through the top portion of the single piece socket; and the plurality of electrically conductive springs, each hole having therein a separate one of the electrically conductive springs;

wherein the single piece socket is positionable on a circuit board with the plurality of holes being in alignment with electrical contacts on the circuit board such that the plurality of springs are electrically interconnecting the contacts and the plurality of pins.

6. A test socket assembly as defined by claim 5 wherein the single-piece socket is comprised substantially of a high-temperature insulating material.

7. A test socket assembly as defined by claim 5 wherein the single-piece socket is comprised substantially of ceramic.

8. A method of forming a test socket assembly, comprising:

providing an integrally formed single piece socket formed substantially of an insulating material, the single piece socket having a top portion and a bottom portion, wherein the single piece socket has a plurality of holes formed therein, the holes being configured to receive a plurality of electrically conductive springs from the bottom portion of the single piece socket, and providing a plurality of pins, each pin being positioned in one of the plurality of holes of the single piece socket, and each pin configured to receive a lead of the integrated circuit to be tested by non-zero insertion force of the leads of the integrated circuit through the top portion of the single piece socket; and positioning the single piece socket on a circuit board with the plurality of holes being in alignment with electrical contacts on the circuit board such that the plurality of springs are electrically interconnecting the contacts and the plurality of pins.

9. The method of claim 8, wherein:

positioning the single piece socket on the circuit board includes fastening the single piece socket to the circuit board using fasteners.

10. The method as defined by claim 8, wherein the single-piece socket is comprised substantially of a high-temperature insulating material.

11. The method as defined by claim 8, wherein the single-piece socket is comprised substantially of ceramic.

* * * * *